US006367064B1

(12) United States Patent
Brown

(10) Patent No.: US 6,367,064 B1
(45) Date of Patent: Apr. 2, 2002

(54) VERIFICATION OF SENSITIVITY LIST INTEGRITY IN A HARDWARE DESCRIPTION LANGUAGE FILE

(75) Inventor: Jeffrey R. Brown, Minnetonka, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/083,716

(22) Filed: May 22, 1998

(51) Int. Cl.$^7$ .......................... G06F 17/50; H03K 19/00

(52) U.S. Cl. ................... 716/18; 716/2; 716/5
(58) Field of Search ........................................ 716/18

(56) References Cited

U.S. PATENT DOCUMENTS

| | | | |
|---|---|---|---|
| 5,331,568 A | * 7/1994 | Pixley | 364/489 |
| 5,465,216 A | * 11/1995 | Rotem et al. | 364/488 |
| 5,502,661 A | 3/1996 | Glunz | 364/578 |
| 5,544,067 A | 8/1996 | Rostoker et al. | 364/489 |
| 5,588,142 A | 12/1996 | Sharritt | 395/500 |
| 5,691,911 A | 11/1997 | Gregory et al. | 364/489 |
| 5,754,454 A | * 5/1998 | Pixley et al. | 364/580 |
| 5,801,956 A | * 9/1998 | Kawamura et al. | 364/489 |

OTHER PUBLICATIONS

J.C. Madre et al., Proving Circuit Correctness using Formal Comparison between Expected and Extracted Behavior, Design Automation Conference, pp. 205–210, Jun. 1988.*
E. Molenkamp et al., Processes with Incomplete Sensitivity lists and their Synthesis Aspects, VHDL International Users' Forum, pp 75–81, Oct. 1997.*
J.C. Madre et al., Automating the Diagnosis and the Rectification of Design Errors with PRIAM, IEEE Computer–Aided Design, pp. 30–33, Nov. 1989.*

K. Park et al., Event Suppression by Optimizing VHDL programs, IEEE Computer–Aided Design of Integrated Circuits, pp. 682–691, Aug. 1998.*
G. Kwon et al., Automatic Verification of Requirements Specifications, Intelligent Information Systems, pp. 277–281, Dec. 1997.*
P. Ashar et al., Verification of RTL Generated from scheduled Behavior in a High Level Synthesis Flow, IEEE Conference on Computer Aided Design, pp. 517–524, Nov. 1998.*

(List continued on next page.)

Primary Examiner—Matthew Smith
Assistant Examiner—A. M. Thompson
(74) Attorney, Agent, or Firm—Knobbe, Martens, Olson & Bear, LLP

(57) ABSTRACT

A method and computer readable medium are provided for analyzing the integrity of a sensitivity list for a process statement in a hardware description language file. An example of a hardware description language to which the method can be applied is VHDL. The method compares an actual sensitivity list from a hardware description language file to an expected sensitivity list that includes one or more parameters expected to appear in the actual sensitivity list. In the event the actual sensitivity list deviates from the expected sensitivity list, the integrity of the actual sensitivity lists is compromised. In this case, an advisory can be generated to identify the deviation, and note its location within the hardware description language file. In this manner, the designer can quickly find the defective sensitivity list and correct it prior to simulation. A sensitivity list verification method can significantly reduce the time and effort involved in sensitivity list debugging. Consequently, the designer can devote more time and resources to the design effort and the end objective of producing the subject design. In many cases, reduction of debugging costs will bear significantly on the final cost of the design. At the same time, reduction of debugging time can shorten the design cycle.

32 Claims, 5 Drawing Sheets

OTHER PUBLICATIONS

Eiriksson, Integrating Formal Verification Methods with a Conventional Project Design Flow, Proceedings 33rd Design Automation Conference, pp. 666–671, Sep. 1996.*

G. Odawara et al., A Logic Verifier Based on Boolean Comparison, Proceedings 23rd ACM/IEEE Design Automation Conference, pp. 208–214, Jun. 1986.*

S. Reddy et al., Novel Verification Framework Combining Structural and OBDD methods in a Synthesis Environment, Proceedings 32nd ACM/IEEE Conference on Design Automation, pp. 414–419, Jun.1995.*

* cited by examiner

VERIFICATION OF SENSITIVITY LIST INTEGRITY IN A HARDWARE DESCRIPTION LANGUAGE FILE

TECHNICAL FIELD

The present invention relates to computer-aided design techniques and, more particularly, to the design of integrated circuitry using hardware description languages.

BACKGROUND INFORMATION

Hardware description languages, such as VHDL (Very High Speed Integrated Circuit Hardware Description Language), are widely used for the design, documentation, and simulation of integrated electronic circuitry. VHDL, for example, offers three different modes for the characterization of a complex integrated circuit: structural, data flow, and behavioral descriptions. The 1993 version of VHDL is described in IEEE Standard VHDL Language Reference Manual, IEEE Std. 1076–1993. The VHDL structural description mode focuses on the arrangement of interconnected hardware components, or "blocks," defined by type and interface. The VHDL data flow description mode breaks down the circuit design into a set of register assignments that take place under the control of specified gating signals. The VHDL behavioral description mode defines the design in terms of a series of sequential process statements that resemble a high-level programming language. Although a design can be characterized by a collection of structural, data flow, and behavioral descriptions, the behavioral description mode will be described in greater detail herein.

In the VHDL behavioral description mode, the designer codes a set of process statements that characterize the function, or "behavior," of a particular block. The process statements execute concurrently, whereas functions set forth within the process statements execute sequentially. Process statements are used to model the behavior of a variety of components such as registers or multiplexers. Each process statement includes a sensitivity list that identifies one or more signals to which the process statement is sensitive. In other words, the sensitivity list specifies particular signals that trigger the behavior defined by the process statement. The process statement only executes in response to a change in the status of one of the signals in the sensitivity list, or in response to a synchronous clocking signal identified in the sensitivity list. In either case, in response to the signal, the process statement executes the associated functions to carry out one or more register transfer operations. Each register transfer operation, in turn, affects the condition of another signal, leading to the execution of other process statements having sensitivity lists that incorporate the affected signal.

The human designer generally is required to manually enter the sensitivity list at the beginning of a process statement. Unfortunately, process statements and associated sensitivity lists can be difficult to generate and maintain. As a design evolves, for example, the content of a sensitivity list and the functions implemented by a process statement are subject to constant change. Moreover, the changes occur within an extremely complex design having potentially hundreds of process statements and sensitivity lists. Consequently, maintenance of the sensitivity lists presents a significant challenge. If a sensitivity list is incorrect, the overall design or portions thereof may fail to simulate correctly. In particular, when the sensitivity list omits the necessary triggering signals, the associated process statement will not execute in response to appropriate signal changes. Instead, the process statement effectively will lie dormant despite changes in signals to which the process statement is intended to respond. Lack of sensitivity list integrity compromises the function of the overall design and causes incorrect simulation.

Identification of the source of the problem, i.e., a defective sensitivity list, is a painstaking manual process that can take hours and, in many cases, days. This manual debugging effort can result in substantial delays and drains resources from the design effort, significantly increasing the design cycle and time to market. In the end, sensitivity list debugging is a costly nuisance that is difficult to avoid due to design complexity and the prevalence of human error.

SUMMARY

The present invention is directed to a method for analyzing the integrity of a sensitivity list for a process statement in a hardware description language file. The present invention also is directed to a computer readable medium encoded with a computer program arranged to execute such a method. An example of a hardware description language to which the method can be applied is VHDL.

The method compares an actual sensitivity list from a behavioral process statement in a hardware description language file to an expected sensitivity list that includes one or more parameters expected to appear in the actual sensitivity list. In the event the actual sensitivity list deviates from the expected sensitivity list, the integrity of the actual sensitivity lists can be compromised. In this case, an advisory can be generated to identify the deviation and, if desired, note its location within the hardware description language file. In this manner, the designer can quickly find the defective sensitivity list and correct it prior to simulation.

A method configured according to the present invention can significantly reduce the time and effort involved in sensitivity list debugging. Consequently, the designer can devote more time and resources to the design effort and the end objective of producing the subject integrated circuit. In many cases, reduction of debugging costs will bear significantly on the final cost of the design. At the same time, reduction of debugging time can shorten the design cycle. Moreover, such a method can simply alleviate the considerable distraction and nuisance incurred by the designer as a result of sensitivity list errors.

The present invention, in one embodiment, provides a method for analyzing a sensitivity list in a hardware description language file, the method comprising selecting an actual sensitivity list from a hardware description language file, the actual sensitivity list including one or more parameters that trigger a process statement, generating an expected sensitivity list including one or more parameters expected to appear in the actual sensitivity list, comparing the actual sensitivity list to the expected sensitivity list, and generating an advisory in the event the actual sensitivity list deviates from the expected sensitivity list.

In another embodiment, the present invention provides a computer readable medium encoded with a computer program, the program being arranged such that, when the program is executed, a computer performs the acts of selecting an actual sensitivity list from a hardware description language file, the actual sensitivity list including one or more parameters that trigger a process statement, generating an expected sensitivity list including one or more parameters expected to appear in the actual sensitivity list, comparing the actual sensitivity list to the expected sensitivity list, and generating an advisory in the event the actual sensitivity list deviates from the expected sensitivity list.

In a further embodiment, the present invention provides a method for analyzing a sensitivity list for a process statement in a hardware description language file, the method comprising accessing a hardware description language file, the hardware description language file including process statements, wherein each of the process statements includes an actual sensitivity list containing one or more signals that trigger the respective process statement, selecting one of the process statements, generating an expected sensitivity list for the selected process statement, the expected sensitivity list containing one or more names including names of signals expected to trigger the selected process statement, verifying whether one or more of the names in the expected sensitivity list is present in the actual sensitivity list for the selected process statement, and generating an advisory in the event one or more of the names in the expected sensitivity list is absent from the actual sensitivity list.

In an added embodiment, the present invention provides a computer readable medium encoded with a computer program, the program being arranged such that, when the program is executed, a computer performs the acts of accessing a hardware description language file, the hardware description language file including process statements, wherein each of the process statements includes an actual sensitivity list containing one or more signals that trigger the respective process statement, selecting one of the process statements, generating an expected sensitivity list for the selected process statement, the expected sensitivity list containing one or more names including names of signals expected to trigger the selected process statement, verifying whether one or more of the names in the expected sensitivity list is present in the actual sensitivity list for the selected process statement, and generating an advisory in the event one or more of the names in the expected sensitivity list is absent from the actual sensitivity list.

In another embodiment, the present invention provides a method for generating an expected sensitivity list for a process statement in a hardware description language file, the method comprising accessing a hardware description language file, the hardware description language file including process statements, selecting one of the process statements, scanning an argument section of the selected process statement, extracting names of signals from the argument section, and generating an expected sensitivity list for the selected process statement, the expected sensitivity list containing the extracted names.

In an additional embodiment, the present invention provides a computer readable medium encoded with a computer program, the program being arranged such that, when the program is executed, a computer performs the acts of accessing a hardware description language file, the hardware description language file including process statements, selecting one of the process statements, scanning an argument section of the selected process statement, extracting names of signals from the argument section, and generating an expected sensitivity list for the selected process statement, the expected sensitivity list containing the extracted names.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
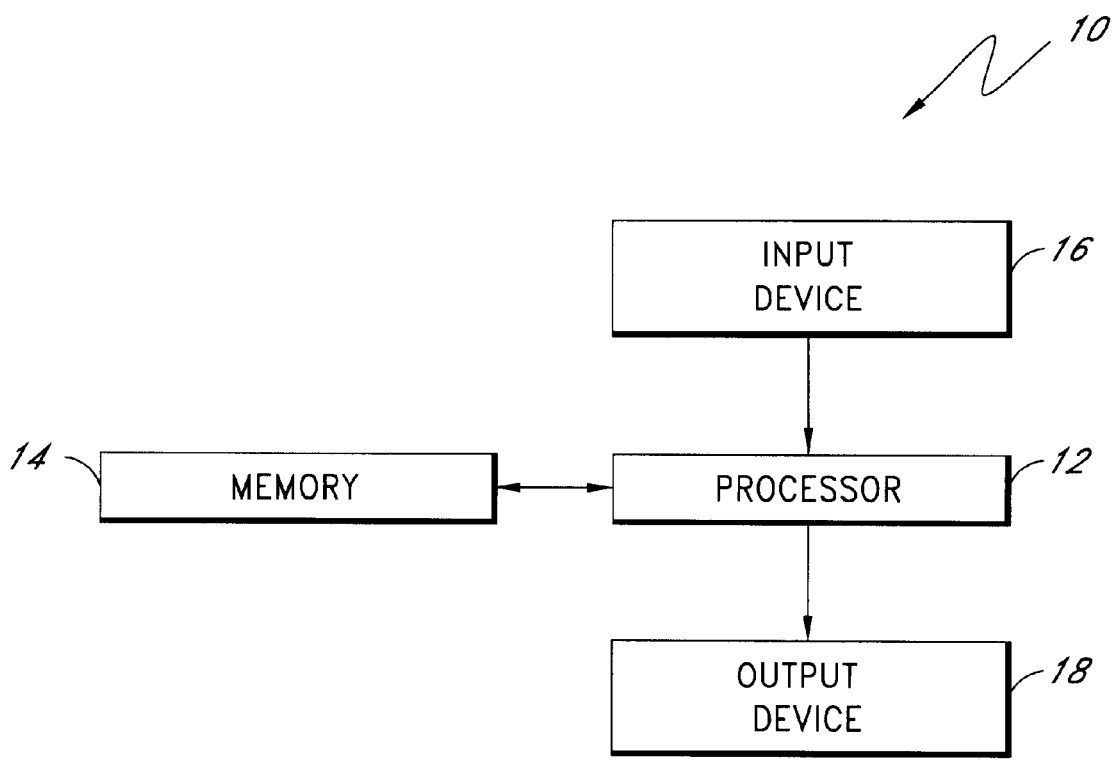
FIG. 1 is a functional block diagram of a system implementing a method for analyzing the integrity of a sensitivity list in a hardware description language file.

FIG. 1 is a functional block diagram of a system 10 implementing a method for analyzing the integrity of a sensitivity list in a hardware description language file in accordance with an embodiment of the present invention. As shown in FIG. 1, system 10 may include a processor 12, memory 14, an input device 16, and an output device 18. Memory 14 may include random access memory (RAM) storing program code that is accessed and executed by processor 12. The program code can be loaded into memory 14 from another memory device, such as a fixed hard drive or removable media device associated with system 10. Processor 12 may take the form of any conventional general purpose single- or multi-chip microprocessor such as a Pentium® processor, a Pentium Pro® processor, an 8051 processor, a MIPS processor, a Power PC® processor, or an Alpha® processor. In addition, processor 12 may take the form of any conventional special purpose microprocessor. Input device 16 may include a conventional keyboard and pointing device such as a mouse or trackball, if desired. Output device 18 may include a computer monitor, such as a CRT or flat panel display, that provides textual and/or graphic output to the user. Further, processor 12, memory 14, input device 16, and output device 18 may be integrated with or form part of a personal computer or computer workstation.

The program code stored in memory 14 can be arranged such that, when executed, processor 12 analyzes the integrity of a sensitivity list in a hardware description language file by comparing the actual sensitivity list to an expected sensitivity list. Processor 12 may generate an advisory in the event the actual sensitivity list deviates from the expected sensitivity list. The program code can be arranged such that processor 12 accesses a hardware description language file, such as a VHDL file. The hardware description language file can be loaded into memory 14, for example, from a fixed hard drive or removable media storage device, for access by processor 12. The program code may allow the user to select a particular hardware description language file via input device 16 in conjunction with the textual and/or graphic output provided by output device 18. Alternatively, the program code may be arranged such that processor 12 accesses a set of hardware description language files provided in a particular directory or folder. It is common that a particular design will be characterized by a long list of hardware description language files, all of which can be analyzed together for sensitivity list integrity.

The program code can be provided as a discrete application that is invoked by the user to analyze the hardware description language files, or integrated with a hardware description language design application such as a VHDL editor. The program code executed by processor 12 for sensitivity list verification can be written, for example, in any script or programming language, and can be written to execute in a matter of seconds. The application can be called by the push of a button, a mouse click, or otherwise, from whatever application is being used to edit the hardware description language code. An example of a VHDL editor is CodeWright 5.0 for Windows, available from Premia Corporation. An example of a hardware description language compilation and simulation package is ModelSim (PE)/Plus 4.7, commercially available from Model Technology. The program code can be carried on a computer-readable data storage medium such as a fixed disk, a removable disk, or tape, and can be loaded into memory 14 for access and execution by processor 12.

The hardware description language file includes process statements, such as VHDL behavioral description process statements. Each process statement includes an actual sensitivity list containing one or more signals that trigger execution of the respective process statement. In other words, the functions defined by the process statement are carried out in response to a change in the status of the signals in the sensitivity list. Also, the process statement can be executed in response to a synchronous clocking signal set forth in the sensitivity list without regard to a change in signal status.

According to the program code, processor 12 can select each of the process statements and generate an expected sensitivity list for each of them. An expected sensitivity list contains one or more names including the names of particular signals that are expected to trigger the selected process statement. The program code can be arranged such that processor 12 generates an expected sensitivity list for each process statement upon selection of the process statement, i.e., in an "on the fly" mode.

Alternatively, processor 12 can generate expected sensitivity lists for each of the process statements in advance of the selection and comparison routine. Although the program code can be arranged to allow individual selection of process statements to be analyzed, in most cases the user will prefer that all process statements be analyzed in a single analysis routine. Indeed, as mentioned above, it is expected that a user will prefer to have all process statements for several hardware description language files analyzed in a single analysis routine.

For each process statement, processor 12 verifies whether the name or names in the expected sensitivity list are present in the actual sensitivity list. In the event one or more names is absent from the actual sensitivity list, processor 12 can be configured to generate an advisory. The advisory may take the form of a simple error message that can be immediately communicated to the user as an advisory, or logged for later communication with all sensitivity list errors discovered within a hardware description language file or set of files. In most cases, it will be desirable to present all error messages together following completion of the analysis routine, or at least following analysis of each hardware description language file. To provide more meaningful output, processor 12 can generate with each advisory a set of information sufficient to identify the suspect sensitivity list.

The program code preferably is further arranged such that processor 12 not only identifies the suspect sensitivity list, but also specifies the particular signal that has been omitted. In particular, processor 12 can produce, via output device 18, a textual and/or graphic representation of a hardware description language file that identifies the potential sensitivity list errors. Processor 12 can allow a user, in conjunction with input and output devices 16, 18, to view advisories indicative of sensitivity list errors within a given hardware description language file. Processor 12 can provide scrolling, indexing, or hypertext linking capabilities that enable a user to move between process statements yielding suspect sensitivity lists. Thus, the presentation of the errors can be consecutive relative to the order of appearance in the file, or indexed or linked according to groups of signals or process statements sharing common characteristics. For example, processor 12 can present a list of process statements having suspect sensitivity lists by name, and allow the user to hypertext link to a selected process statement in the list to view the potential sensitivity list error. Alternatively, the user can carry out a simple scrolling function between consecutive process statements.

The process statements can be represented in a conspicuous manner, e.g., by highlighting or redlining, to identify the potentially problematic sensitivity list for the user. If desired, the missing signal also can be inserted into the sensitivity list in a highlight or redline mode. Presence of the missing signal in a function set forth in the process statement provides an indication that the signal also should be present in the sensitivity list. Thus, the missing signal can be identified in the body of the process statement relative to a function by which it is invoked. In this manner, the user can more immediately understand the context in which the signal is used, and determine whether it should be added to the sensitivity list or whether the function is in error. With a convenient listing of potential sensitivity list errors, a user can minimize the time and effort spent in manual debugging. As described above, the mode by which the sensitivity list errors are presented and organized will be subject to variation. Accordingly, it may be desirable to incorporate a number of presentation options for individual selection or combination on a user preference basis.

The program code, in a further embodiment, also can be arranged to verify the presence of "extra" signals in the sensitivity list. In other words, in addition to verifying whether each of the names in the expected sensitivity list is present in the actual sensitivity list, processor 12 also can perform a converse verification routine. Specifically, processor 12 can verify whether each of the names in the actual sensitivity list is present in the expected sensitivity list. In this way, identification of extra names present in the actual sensitivity list and missing from the expected sensitivity list will serve to identify superfluous names that have been inadvertently added to the actual sensitivity list. In this case, the process statement would trigger each time the superfluous signal changes its state even though the functions set forth in the process statement do not invoke the signal. In many cases, this false triggering of the process statement can be relatively harmless in terms of proper operation of the simulation. To the extent a process statement includes functions that increment a variable or otherwise alter the state of another signal, however, false triggering can be distratous. At the same time, false triggering can consume unnecessary processing resources and simply is incorrect. Therefore, arrangement of the program code to identify "extra" signals named in the actual sensitivity list is desirable for both proper simulation and enhanced processing efficiency. If such extra signal names are detected, processor 12 can generate an appropriate advisory conveying, if desired, the identification and location of the particular sensitivity list and signal name for ready correction by the user, substantially as described above with respect to missing signal names.

The program code in memory 14 can be arranged, in a further embodiment, to correct suspect sensitivity lists in an automated manner. For example, in combination with identifying those missing signal names that are omitted from the actual sensitivity list and/or those extra signal names that are inadvertently included in the actual sensitivity list, processor 12 can be configured to automatically correct the discrepancies. In particular, processor 12 can add a missing signal name to the actual sensitivity list, or delete an extra signal name from the actual sensitivity list. The correction can be undertaken automatically without user intervention based on the content of the expected sensitivity list. In this case, the user should have a high degree of confidence in the accuracy of the expected sensitivity list. If the expected sensitivity list is generated with a high degree of accuracy, as will be described herein, the user may be comfortable with automatic correction.

In many cases, regardless of the accuracy of the expected sensitivity list, the user will desire the opportunity to approve each correction in advance, inasmuch as the correction alters the code. Thus, processor 12 can step through a set of suspect sensitivity lists under user control, like the spell check or find-and-replace functions of a conventional word processing program, providing suggested corrections for user approval. The suggested corrections can be displayed within a representation of the sensitivity list on output device 18, or in a modal window displayed on the output device that conveys a proposed correction and seeks user approval. Upon user approval, e.g., by a mouse click or other manipulation of input device 16, processor 12 would proceed to enter the correction and alter the contents of the hardware description language file code as appropriate.

Figure 2:
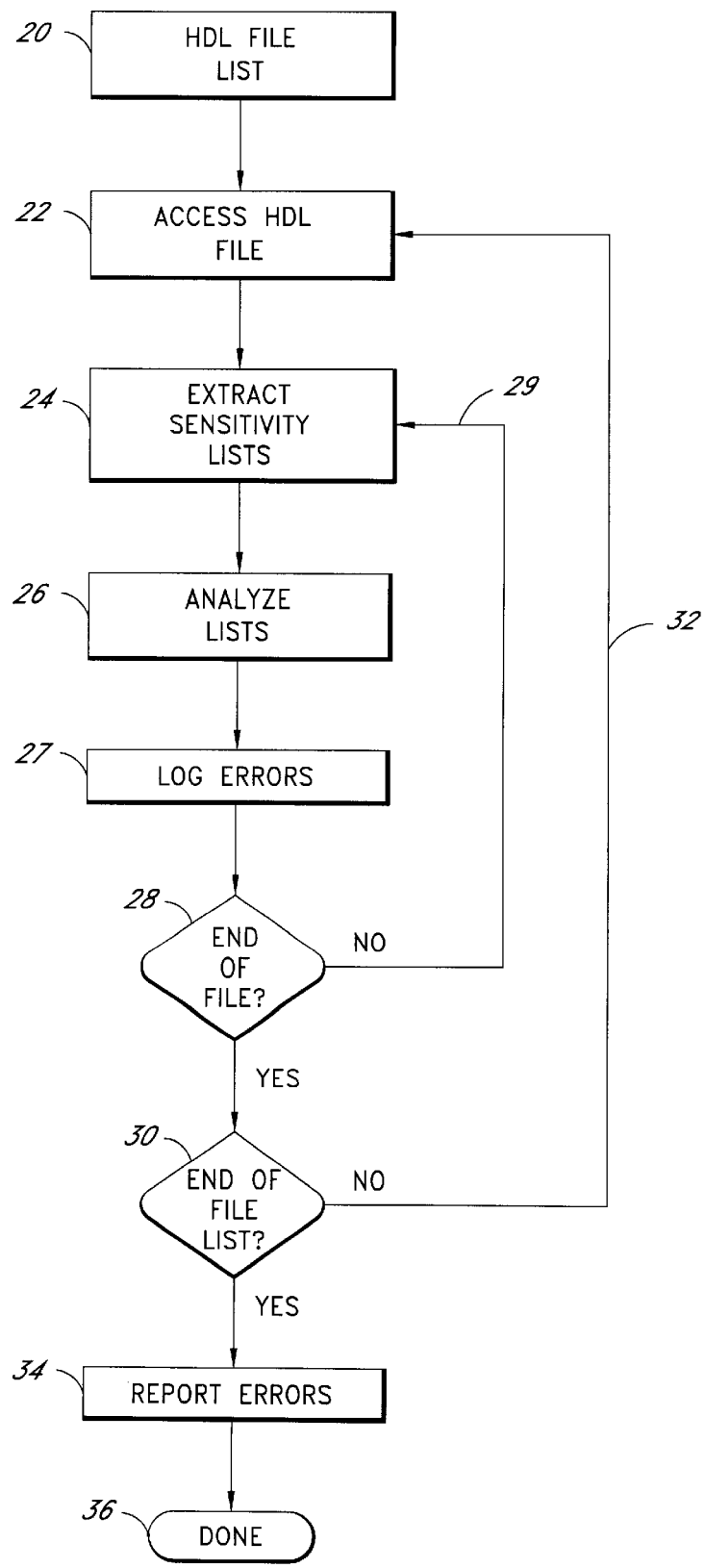
FIG. 2 is a flow diagram illustrating the operation of a method for analysis of the integrity of a sensitivity list in a hardware description language file.

FIG. 2 is a flow diagram illustrating the operation of a method for analysis of the integrity of a sensitivity list in a hardware description language file. As indicated by block 20, processor 12 scans a list of hardware description language files, such as VHDL files, stored on a fixed hard drive or removable media drive, and selects one of the files to be loaded into memory 14. Selection of the file can be sequential or in any order depending on user preference. After the hardware description language file has been loaded, processor 12 accesses the contents of the file, as indicated by block 22. Processor 12 then extracts one or more actual sensitivity lists from the hardware description language file, as indicated by block 24. As indicated by block 26, processor 12 checks each of the actual sensitivity lists for bugs, i.e., for missing or extra signal names, by reference to an expected sensitivity list. In this manner, processor verifies the integrity of each of the actual sensitivity lists set forth in the hardware description language file.

In one embodiment, processor 12 can be configured to generate an expected sensitivity list for each of the process statements as an associated actual sensitivity list is extracted. In other words, processor 12 can generate the expected sensitivity list "on the fly" in response to extraction of a particular actual sensitivity list. Alternatively, processor 12 generates expected sensitivity lists for all process statements in the hardware description language file in advance of extraction of the actual sensitivity lists for verification. During verification, processor 12 logs errors in the event the actual sensitivity lists deviate from the expected sensitivity lists or vice versa, as indicated by block 27. The errors can be stored and communicated simultaneously after processor 12 has completed the verification cycle for all of the process statements and actual sensitivity lists in the hardware description language file. The errors can be logged by entry into a separate error file, or by modifying the contents of the subject hardware description language file to identify the errors. After each error is logged, processor 12 determines whether it has reached the end of the particular file, as indicated by block 28.

If not, as indicated by loop 29, processor 12 returns to extract the next actual sensitivity list in the hardware description language file and repeats the acts indicated by blocks 24, 26, and 27. If processor 12 has reached the end of the file, it determines whether it has reached the end of the list of hardware description language files, as indicated by block 30. If not, processor 12 opens the next hardware description language file in the list and repeats the acts indicated by blocks 22, 24, 26, 28, and 30, as indicated by loop 32. If processor 12 has reached the end of the file list, it reports the logged errors to the user, as indicated by block 34, and terminates the verification cycle, as indicated by block 36. Although the verification method has been described with respect to FIG. 2 as involving verification of all of the actual sensitivity lists for all of the hardware description language files in the file list, the method may be implemented to process a subset of files and/or a subset of sensitivity lists within a file. In this manner, the user can specify those files and/or lists to be analyzed.

Figure 3:
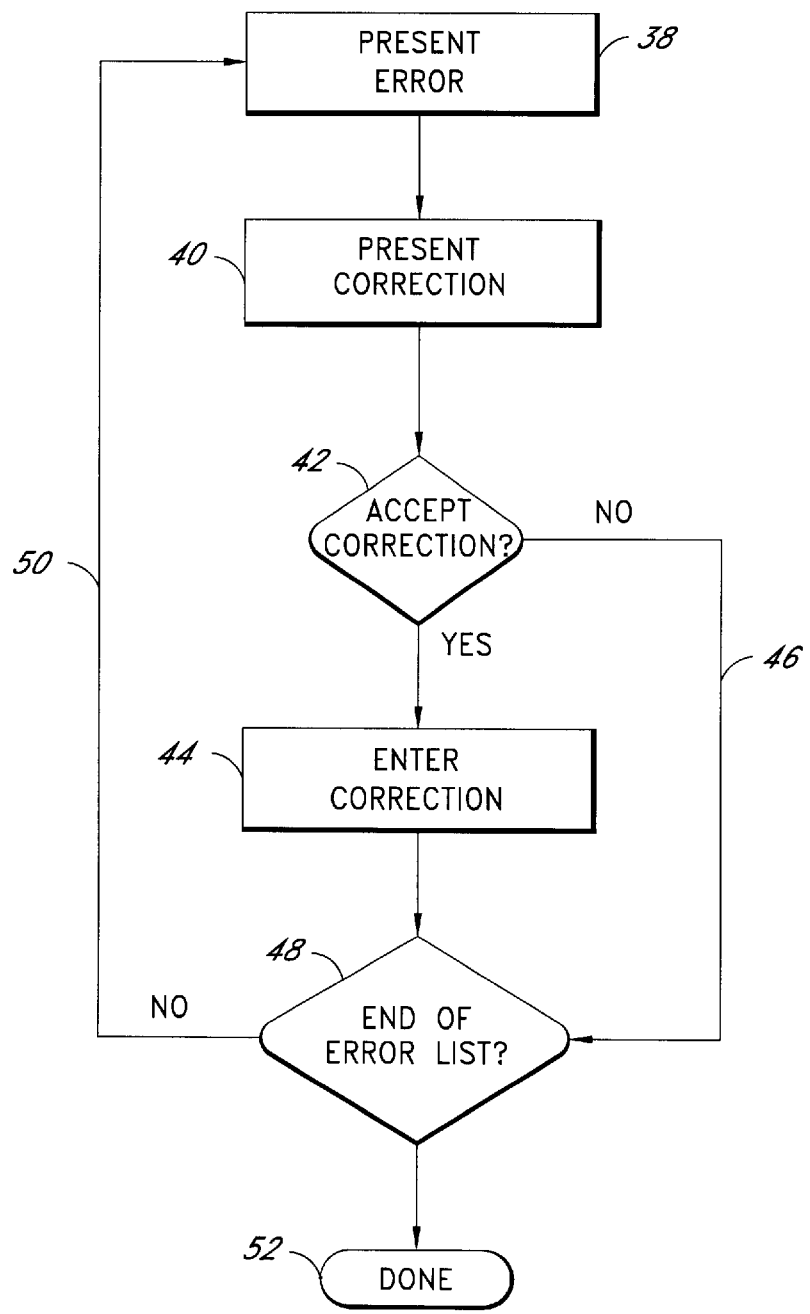
FIG. 3 is a flow diagram illustrating a correction routine for use in a method as shown in FIG.2.

FIG. 3 is a flow diagram illustrating a correction routine for use in a method as shown in FIG. 2. Specifically, as shown in FIG. 3, processor 12 can be configured to carry out a routine whereby errors logged in a method as shown in FIG. 2 are automatically corrected, or at least corrected subject to user approval. For example, processor 12 can retrieve an error file or access errors identified within a pertinent hardware description language file, and present the errors sequentially as indicated by block 38. The errors can be presented in an error list or in the context of the hardware description language file in which they occur. In particular, processor 12 can drive output device 18 to display a representation of the hardware description language file with scrolling, indexing, or hypertext link capabilities as previously described. With each error, processor 12 can select an appropriate correction by reference to the expected sensitivity list. For example, if a signal name is present in the expected sensitivity list and missing from the actual sensitivity list, processor 12 can present via output device 18 a proposed correction in which the missing signal name is added to the actual sensitivity list. If a signal name is present in the actual sensitivity list but missing from the expected sensitivity list, processor 12 can drive output device 18 to present a proposed correction in which the extra signal name is deleted from the actual sensitivity list. Presentation of the proposed correction is indicated by block 40.

As indicated by block 42, processor 12 allows the user to indicate whether the proposed correction is accepted, for example, by the click of a pointing device or a keyboard entry. If the user accepts the proposed correction, processor 12 enters the correction into the hardware description language file under scrutiny, as indicated by block 44. If the user does not accept the proposed correction, as indicated by branch 46, processor 12 can determine whether it has reached the end of the error list, as indicated by block 48. Also, the program code can be arranged to allow the user to override the proposed correction in favor of a user-specified correction. In other words, processor 12 may allow the user to enter a correction for each error without regard to the suggestions drawn from the expected sensitivity list. If processor 12 has not reached the end of the error list, it repeats the process, as indicated by loop 50, and presents the next potential sensitivity list error to the user. If the end of the error list has been reached, processor 12 terminates the error correction process, as indicated by block 52, or proceeds to another hardware description language file for which sensitivity list errors have been logged.

Figure 4:
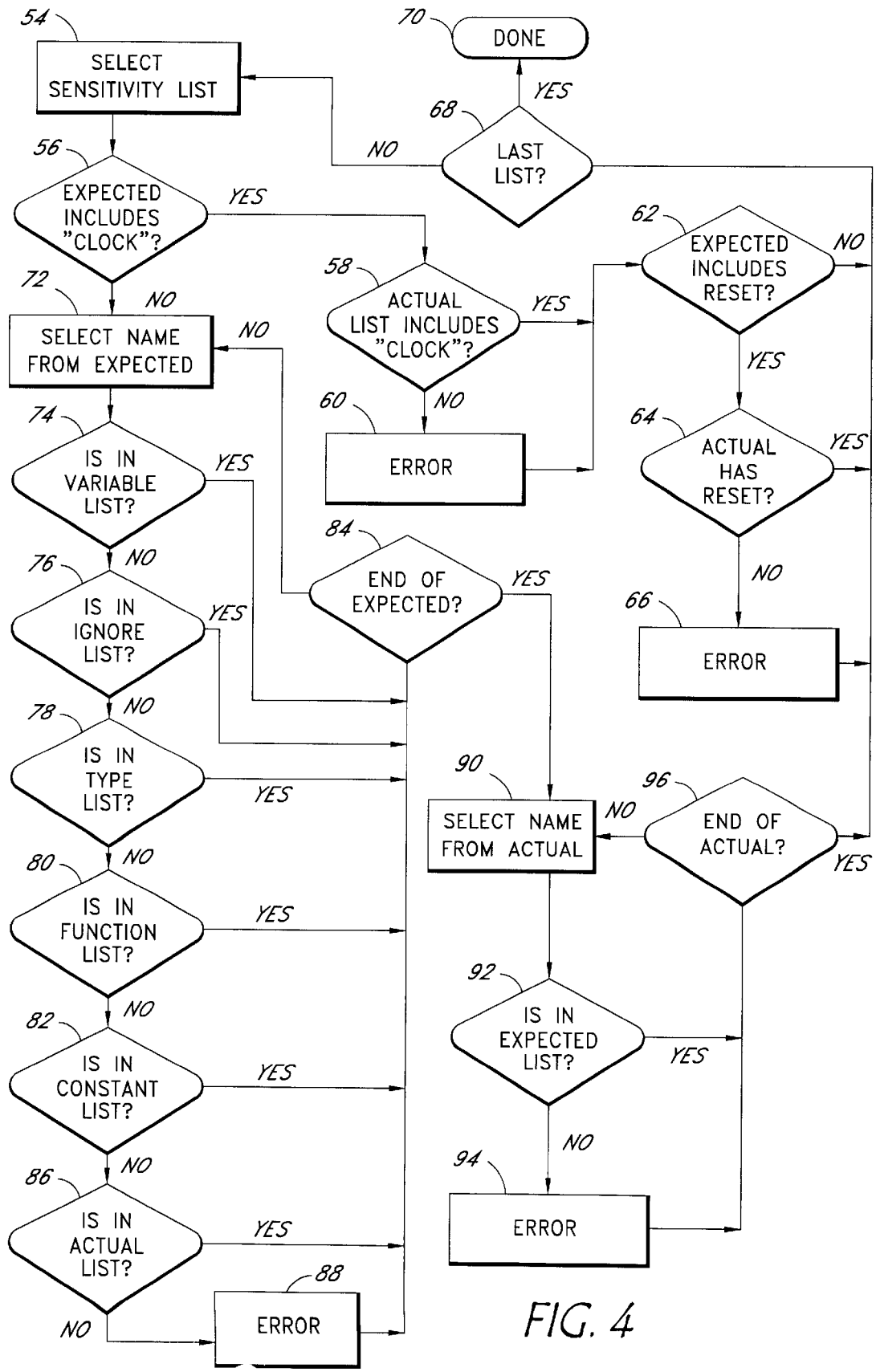
FIG. 4 is a flow diagram illustrating a method as shown in FIG. 2 in greater detail.

FIG. 4 is a flow diagram illustrating a sensitivity list analysis method as shown in FIG. 2 in greater detail. As indicated by block 54, processor 12 selects an actual sensitivity list associated with one of the process statements in a particular hardware description language file. Processor 12 first checks whether the corresponding expected sensitivity list includes a "clock" signal, as indicated by block 56, which would indicate that the process statement is triggered by a synchronous clock. If so, processor 12 verifies whether the actual sensitivity list includes a clock signal, as indicated by block 58. If not, processor 12 logs an error, as indicated by block 60. In either case, the presence of a clock signal means that it is not necessary to check for additional triggering signals because the process statement will always execute synchronously at the clocking frequency. Thus, verification of the actual sensitivity list generally can be avoided for clocked process statements, thereby limiting the scope of the process.

Processor 12 next determines whether the expected sensitivity list includes a "reset" signal, as indicated by block 62, which generally is required whenever a process statement is triggered by a clock signal. If the expected sensitivity list includes a reset signal, processor 12 verifies whether the actual sensitivity list includes the reset signal, as indicated by block 64. If the actual sensitivity list does not include the reset signal, processor 12 logs an error, as indicated by block 66. Following verification of the reset signal, processor 12 determines whether it has reached the last actual sensitivity list in the hardware description language file, or group of files, as indicated by block 68. If not, processor 12 returns to select the next sensitivity list according to block 54. If the last list has been reached, the process terminates, as indicated by block 70.

If the expected sensitivity list does not include a clock signal, processor 12 proceeds to verify the signal names listed in the expected sensitivity list against those listed in the actual sensitivity list. First, processor 12 selects a signal name from the expected sensitivity list, as indicated by block 72. The program code executed by processor 12 can be arranged for wholesale verification of the expected signal names against the actual signal names. To limit the scope of the verification task, however, processor 12 may exclude one or more names from consideration, as indicated by blocks 74, 76, 78, 80, 82. At the outset of the verification process, processor 12 can scan a given process statement to identify variables. The variables can be identified by reference to a preceding variable descriptor given the convention of the particular hardware description language used. Thus, in advance of the verification analysis, processor 12 can assemble a list of variables, and exclude them from consideration, as indicated by block 74. Also, the user can enter a list containing signals to be disregarded in the expected versus actual comparison, as indicated by block 78. The user can enter the list for the entire verification process or for verification of individual hardware description language files.

Further, processor 12 can be configured to automatically assemble lists of names to be excluded based on global declarations within the hardware description language file. As indicated by block 80, for example, processor 12 can assemble a list of names that refer to types, as indicated in a global declaration in the hardware description language file. Similarly, processor 12 can assemble a list of names that denote globally declared functions, as indicated by block 82. Processor 12 also can construct a list of constants by reference to global declarations in the hardware description language file, as indicated by block 84. In this manner, processor 12 obtains a variable list that contains variables that should be excluded, an ignore list containing signal names that should be excluded according to user input, a type list containing types that should be excluded, a function list containing functions that should be excluded, and a constant list containing constants that should be excluded.

For each signal name selected from the expected sensitivity list, processor 12 first determines whether it falls in the variable list, ignore list, type list, function list, or constant list, as indicated by blocks 74, 76, 78, 80, 82. If so, processor 12 essentially ignores the subject signal name, and does not proceed to verify whether it is present in the actual sensitivity list. Instead, processor 12 determines whether it has reached the end of the particular expected sensitivity list, i.e., whether it has selected the last signal name in the expected sensitivity list, as indicated by block 84. If not, processor 12 proceeds to select the next applicable signal name and again determines whether the signal name falls in any of the excluded lists. If a selected signal name is not present in any of the excluded lists, processor 12 determines whether it is present in the actual sensitivity list, as indicated by block 86. If not, processor 12 logs a potential error, as indicated by block 88, and proceeds to the next signal name in the expected sensitivity list or to a subsequent expected sensitivity list.

Once all signal names in an expected sensitivity list have been verified for presence in the actual sensitivity list and errors have been logged for missing signals as appropriate, processor 12 next proceeds to verify the presence of extra signals in the actual sensitivity list. In other words, processor 12 determines whether the actual sensitivity list includes additional signal names that are not present in the expected sensitivity list. With further reference to FIG. 4, after processor 12 has reached the end of an expected sensitivity list, as indicated by block 84, it selects the first signal name in the actual sensitivity list, as indicated by block 90. Processor 12 then determines whether the selected signal name from the actual sensitivity list is present in the expected sensitivity list, as indicated by block 92. If not, processor 12 logs a potential error, as indicated by block 94. The logged error can be communicated to the user individually, but preferably along with a group of potential errors discovered for a hardware description language file or set of files. In either case, processor 12 then determines whether it has reached the end of the actual sensitivity list, as indicated by block 96. If not, processor 12 proceeds to the next signal name in the actual sensitivity list to verify whether it is an extra signal, repeating the process outlined by blocks 90, 92, 94. After processor 12 has exhausted the list of signal names in an actual sensitivity list for identification of extra signals, it proceeds to the next sensitivity list in the hardware description language file. If processor 12 determines that it reached the last sensitivity list, as indicated by block 68, it terminates the analysis process as indicated by block 70. Following termination, processor 12 can immediately report the logged errors to the user or wait for a user request.

Figure 5:
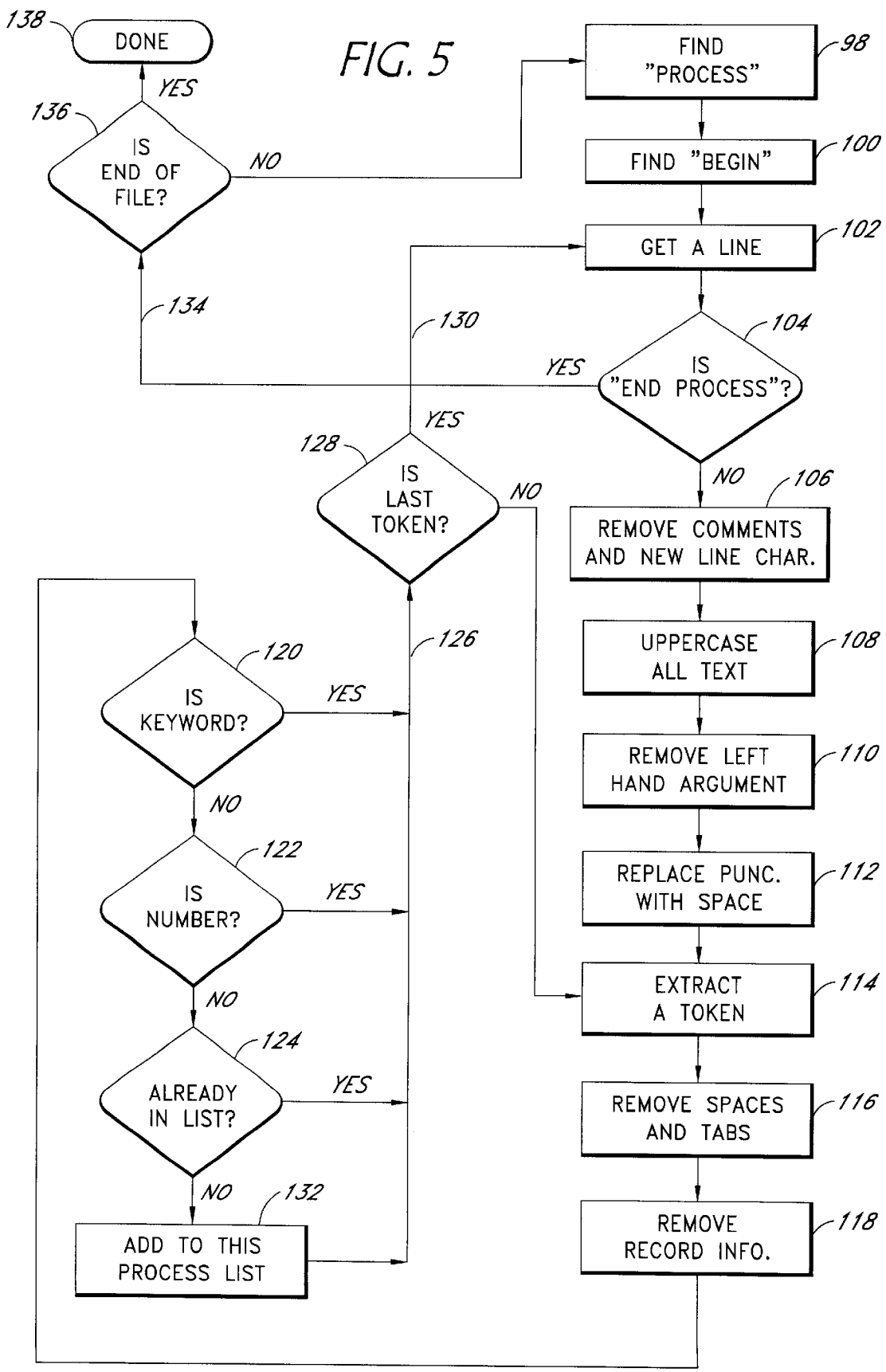
FIG. 5 is a flow diagram illustrating generation of an expected sensitivity list for use in a method as shown in FIGS. 2 and 4.

FIG. 5 is a flow diagram illustrating generation of an expected sensitivity list for use in a method as shown in FIGS. 2 and 4. To analyze sensitivity list integrity as described with reference to FIGS. 2 and 4, it is necessary to generate an expected sensitivity list. In essence, processor 12 filters out extraneous characters to reduce the process statement to a list of signal names. An expected sensitivity list can be generated for each actual sensitivity list as it is selected for analysis by processor 12. However, processor 12 preferably generates expected sensitivity lists for a number of actual sensitivity lists in advance of the verification process. In either case, the expected sensitivity list can be generated substantially as shown in the example of FIG. 5. First, processor 12 identifies a process statement by finding the keyword "process" in the hardware description language file, as indicated by block 98. For ease of description, an example of a process statement is set forth below:

process (Y. Z)
    begin
        X<=Y OR Z.val;—comments
    end process;

After identifying a process statement, processor 12 identifies the body of the process statement by finding keyword "begin," as indicated by block 100. Processor 12 then gets the next line following "begin," as indicated by block 102, and determines whether the line contains the "end process" statement, as indicated by block 104. In the above process statement, processor 12 would obtain the following line:

X<=Y OR Z.val;=comments

The "end process" statement would indicate that no further lines remain in the body of the process statement, and typically would be separated from the "begin" statement by one or more function statements. If the next line is not the "end process" statement, processor 12 next removes all comments and new line characters, as indicated by block 106. Comments can be identified in the exemplary convention of the above process statement by reference to the "—" characters. After removing the comment and new line characters, processor 12 yields the following remaining characters:

X<=Y OR Z.val;

Processor 12 next converts all remaining text to uppercase, as indicated by block 108, yielding:

X<=Y OR Z.VAL;

Processor 12 then removes the left hand argument of the function statement, as indicated by block 110, by reference to the operator, which is "<=" in this example. The remaining statement is:

Y OR Z.VAL;

Next, processor 12 generally replaces all punctuation with a space, as indicated by block 112. One exception is the period ("." ), which indicates a record. The result produces:

Y OR Z.VAL

With the function statement reduced as described above, processor 12 can readily extract a signal name, or "token," as indicated by block 114. Thus, in this example, processor 12 would first extract the "T" character. As indicated by blocks 116 and 118, respectively, processor 12 further filters the token by removing spaces and tabs and record information, e.g., the ".VAL" information. As one alternative, removal of tabs, as indicated by block 116, could be carried out by replacing all tabs with spaces in either of the acts indicated by blocks 106 or 112. The resulting spaces then could be removed as indicated in block 116.

In any event, processor 12 determines whether the extracted signal represents a keyword, or a number, or is already in the expected sensitivity list (from a previous extraction cycle), as indicated by blocks 120, 122, 124, respectively. In any of such cases, if true, processor 12 discards the token and attempts to repeat the process to identify additional tokens, as indicated by loop 126. If processor 12 determines that the subject token is the last one in the function statement line, as indicated by block 128, it returns to obtain the next line in the process statement, if any, as indicated by loop 130. If the token does not satisfy the keyword or number cases, and is not already in the expected sensitivity list, processor 12 adds it to the expected sensitivity list for use in the verification process, as indicated by block 132. A token may already be on the expected sensitivity list as a consequence of a prior extraction cycle directed to a previous function statement line in which the token also appears.

Following addition of the token to the expected sensitivity list or exclusion of the token as a keyword, number, or already listed token, processor 12 returns for another extraction cycle, as indicated by loop 126. In a second extraction cycle directed to the process statement of this example, processor 12 extracts the "OR" term. After attempting to remove spaces and tabs and remove record information, according to blocks 116, 118, respectively, processor 12 determines that the "OR" term represents a keyword, according to block 120, and discards it. In a third extraction cycle, processor 12 extracts the Z.VAL token and removes spaces and tabs, as indicated by block 116, as well as record information, as indicated by block 118. This operation reduces the Z.VAL token to "Z." After determining that the "Z" signal name is not a keyword or a number, and is not already on the expected sensitivity list, processor 12 adds it to the expected sensitivity list.

Once the processor 12 has extracted the last token in the function statement, Z, in this example, it proceeds to the next line in the process statement, as indicated by loop 130. If the next line is "end process," as indicated by block 104, processor 12 has reached the end of the process statement. The resulting expected sensitivity list in this example is "Y, Z." Accordingly, the actual sensitivity list for the process statement should include the two signal names "Y, Z." After reaching the end of the process statement, processor 12 determines whether it has reached the end of the hardware description language file or set of files, as indicated by loop 134 and block 136. If not, processor 12 repeats the process by finding the next process statement and generating an expected sensitivity list. If it has reached the end of the file or set of files, processor 12 has generated expected sensitivity lists for all process statements such files, and terminates the process, as indicated by block 138. In either case, processor 12 stores the expected sensitivity lists in memory 14 for subsequent use in the sensitivity list analysis process. The process described with reference to FIG. 5 represents one exemplary mode for generating the expected sensitivity lists necessary for the verification process. However, other approaches may occur to those skilled in the art having benefit of the present disclosure.

Assuming that the signal name "Y" were missing from the exemplary process statement, the process statement would not execute properly, possibly disrupting the overall simulation based on the hardware description language file. Specifically, although the function statement in the body of the process statement invokes the signal name "Y," that signal name is not present in the actual sensitivity list. Therefore, the process statement will fail to execute in response to changes in the status of the signal associated with signal name "Y." In other words, the actual sensitivity list will not properly trigger the process statement. To quickly identify the potential error for the user, processor 12 can drive output device 18 to highlight the missing signal in a variety of ways as described above. For purposes of illustration, however, processor 12 can present an edited process statement via output device 18 such that the original process statement:

process (Z)
      begin
        X<=Y OR Z.val;—comments
      end process;

in which the "Y" signal name is missing from the actual sensitivity list, is represented to the user as:

process (Y, Z)
      begin
        X<=Y OR Z.val;—comments
      end process;

In this manner, processor 12 presents the user with the proposed correction of the process statement by adding the missing "T" signal name to the actual sensitivity list, e.g., in a highlighted or redlined manner. At the same time, the "Y" signal name can be highlighted or redlined in the body of the process statement to note its invocation. In one embodiment, the user can accept the proposed correction, decline it, or override it with other user-specified corrections. In any event, the user is able to verify and correct the integrity of the actual sensitivity lists to ensure proper simulation.

A number of embodiments of the present invention have been described. Nevertheless, it will be understood that various modifications may be made without departing from the spirit and scope of the invention. Accordingly, other embodiments are within the scope of the following claims.

What is claimed is:

1. A method for analyzing a sensitivity list of a process statement in a hardware description language file, the method comprising:
   accessing a hardware description language file, the hardware description language file including process statements, wherein each of the process statements includes an actual sensitivity list containing one or more signals that trigger the respective process statement;
   selecting one of the process statements;
   generating an expected sensitivity list for the selected process statement, the expected sensitivity list containing one or more names including names of signals expected to trigger the selected process statement;
   verifying whether one or more of the names in the expected sensitivity list is present in the actual sensitivity list for the selected process statement; and
   generating an advisory in the event one or more of the names in the expected sensitivity list is absent from the actual sensitivity list.

2. The method of claim 1, wherein the act of generating the expected sensitivity list includes generating expected sensitivity lists for each of the process statements in the hardware description language file.

3. The method of claim 2, further comprising repeating the selecting act, the verifying act, and the second generating act for each of the process statements in the hardware description language file.

4. The method of claim 1, wherein the advisory is a first advisory, the method further comprising:
   verifying whether each of the names in the actual sensitivity list is present in the expected sensitivity list; and
   generating a second advisory in the event one or more of the names in the actual sensitivity list is absent from the actual sensitivity list.

5. The method of claim 4, wherein the first advisory is an error message indicating a potential error in the actual sensitivity list, and the second advisory is an error message indicating a potential error in the actual sensitivity list.

6. The method of claim 1, wherein the act of generating the expected sensitivity list includes generating expected sensitivity lists for a plurality of the process statements in the hardware description language file in advance of the selecting and verifying acts.

7. The method of claim 1, further comprising excluding the names of one or more signals in the expected sensitivity list from consideration in the first verification act based on signal type.

8. The method of claim 1, further comprising excluding the names of one or more signals in the expected sensitivity list from consideration in the first verification act based on user specification.

9. The method of claim 1, further comprising excluding the names of one or more signals in the expected sensitivity list representing constants from consideration in the first verification act.

10. The method of claim 1, further comprising excluding the names of one or more functions from the expected sensitivity list.

11. The method of claim 1, further comprising excluding the names of one or more signals in the expected sensitivity list representing variables from consideration in the first verification act.

12. The method of claim 1, further comprising:
   verifying, in the event the expected sensitivity list includes a clock parameter, whether the actual sensitivity list includes the clock parameter; and
   generating an advisory in the event the actual sensitivity does not include the clock parameter.

13. The method of claim 12, further comprising:
   verifying, in the event the expected sensitivity list includes a clock parameter, whether the expected sensitivity list includes a reset parameter;
   verifying, in the event the expected sensitivity list includes the reset parameter, whether the actual sensitivity list includes the reset parameter; and
   generating a second advisory in the event the actual sensitivity list does not include the reset parameter.

14. The method of claim 1, wherein the hardware description language file is a VHDL file.

15. A computer readable medium encoded with a computer program, the program being arranged such that, when the program is executed, a computer performs the acts of:
   accessing a hardware description language file, the hardware description language file including process statements, wherein each of the process statements includes an actual sensitivity list containing one or more signals that trigger the respective process statement;
   selecting one of the process statements;
   generating an expected sensitivity list for the selected process statement, the expected sensitivity list containing one or more names including names of signals expected to trigger the selected process statement;
   verifying whether one or more of the names in the expected sensitivity list is present in the actual sensitivity list for the selected process statement; and
   generating an advisory in the event one or more of the names in the expected sensitivity list is absent from the actual sensitivity list.

16. The computer readable medium of claim 15, the program being further arranged such that the act of generating the expected sensitivity list includes generating expected sensitivity lists for each of the process statements in the hardware description language file.

17. The computer readable medium of claim 16, the program being further arranged such that the computer repeats the selecting act, the verifying act, and the second generating act for each of the process statements in the hardware description language file.

18. The computer readable medium of claim 15, wherein the advisory is a first advisory, the program being further arranged such that computer executes the acts of:
- verifying whether each of the names in the actual sensitivity list is present in the expected sensitivity list; and
- generating a second advisory in the event one or more of the names in the actual sensitivity list is absent from the actual sensitivity list.

19. The computer readable medium of claim 18, wherein the first advisory is an error message indicating a potential error in the actual sensitivity list, and the second advisory is an error message indicating a potential error in the actual sensitivity list.

20. The computer readable medium of claim 15, the program being further arranged such that the act of generating the expected sensitivity list includes generating expected sensitivity lists for a plurality of the process statements in the hardware description language file in advance of the selecting and verifying acts.

21. The computer readable medium of claim 15, the program being further arranged such that the computer excludes the names of one or more signals in the expected sensitivity list from consideration in the first verification act based on signal type.

22. The computer readable medium of claim 15, the program being further arranged such that the computer excludes the names of one or more signals in the expected sensitivity list from consideration in the first verification act based on user specification.

23. The computer readable medium of claim 15, the program being further arranged such that the computer excludes the names of one or more signals in the expected sensitivity list representing constants from consideration in the first verification act.

24. The computer readable medium of claim 15, the program being further arranged such that the computer excludes the names of one or more functions from the expected sensitivity list.

25. The computer readable medium of claim 15, the program being further arranged such that the computer excludes the names of one or more signals in the expected sensitivity list representing variables from consideration in the first verification act.

26. The computer readable medium of claim 15, the program being further arranged such that the computer executes the acts of:
- verifying, in the event the expected sensitivity list includes a clock parameter, whether the actual sensitivity list includes the clock parameter; and
- generating an advisory in the event the actual sensitivity does not include the clock parameter.

27. The computer readable medium of claim 26, the program being further arranged such that the computer executes the acts of:
- verifying, in the event the expected sensitivity list includes a clock parameter, whether the expected sensitivity list includes a reset parameter;
- verifying, in the event the expected sensitivity list includes the reset parameter, whether the actual sensitivity list includes the reset parameter; and
- generating a second advisory in the event the actual sensitivity list does not include the reset parameter.

28. The computer readable medium of claim 15, wherein the hardware description language file is a VHDL file.

29. A method for analyzing a sensitivity list in a hardware description language file, the method comprising:
- selecting an actual sensitivity list from a hardware description language file, the actual sensitivity list including one or more parameters that trigger a process statement;
- generating an expected sensitivity list including one or more parameters expected to appear in the actual sensitivity list;
- comparing the actual sensitivity list to the expected sensitivity list; and
- generating an advisory in the event the actual sensitivity list deviates from the expected sensitivity list.

30. A computer readable medium encoded with a computer program, the program being arranged such that, when the program is executed, a computer performs the acts of:
- selecting an actual sensitivity list from a hardware description language file, the actual sensitivity list including one or more parameters that trigger a process statement;
- generating an expected sensitivity list including one or more parameters expected to appear in the actual sensitivity list;
- comparing the actual sensitivity list to the expected sensitivity list; and
- generating an advisory in the event the actual sensitivity list deviates from the expected sensitivity list.

31. A method for generating an expected sensitivity list for a process statement in a hardware description language file, the method comprising:
- accessing a hardware description language file, the hardware description language file including process statements;
- selecting one of the process statements;
- scanning an argument section of the selected process statement;
- extracting names of signals from the argument section; and
- generating an expected sensitivity list for the selected process statement, the expected sensitivity list containing the extracted names.

32. A computer readable medium encoded with a computer program, the program being arranged such that, when the program is executed, a computer performs the acts of:
- accessing a hardware description language file, the hardware description language file including process statements;
- selecting one of the process statements;
- scanning an argument section of the selected process statement;
- extracting names of signals from the argument section; and
- generating an expected sensitivity list for the selected process statement, the expected sensitivity list containing the extracted names.

* * * * *